(12) United States Patent
Xie et al.

(10) Patent No.: US 12,072,687 B2
(45) Date of Patent: Aug. 27, 2024

(54) METHOD, SYSTEM AND APPARATUS FOR FLEXIBLE COMPONENT ROUTING DESIGN

(71) Applicant: Ford Global Technologies, LLC, Dearborn, MI (US)

(72) Inventors: Cherry Xie, Nanjing (CN); Jason Zhang, Nanjing (CN); Ethan Wang, Nanjing (CN); Chris Nie, Nanjing (CN)

(73) Assignee: Ford Global Technologies, LLC, Dearborn, MI (US)

( * ) Notice: Subject to any disclaimer, the term of this patent is extended or adjusted under 35 U.S.C. 154(b) by 385 days.

(21) Appl. No.: 17/685,150

(22) Filed: Mar. 2, 2022

(65) Prior Publication Data

US 2022/0299983 A1 Sep. 22, 2022

(30) Foreign Application Priority Data

Mar. 4, 2021 (CN) .......................... 202110241234.5

(51) Int. Cl.
*G01B 5/20* (2006.01)
*B21D 7/14* (2006.01)
*B21D 9/05* (2006.01)
*B29C 53/08* (2006.01)
*G05B 19/418* (2006.01)

(52) U.S. Cl.
CPC ......... *G05B 19/41815* (2013.01); *B21D 7/14* (2013.01); *B21D 9/05* (2013.01); *B29C 53/083* (2013.01); *G01B 5/20* (2013.01)

(58) Field of Classification Search
CPC ....................................................... G01B 5/20
See application file for complete search history.

(56) References Cited

U.S. PATENT DOCUMENTS

| 7,383,162 | B2 | 6/2008 | Hashima et al. | |
|---|---|---|---|---|
| 2003/0126576 | A1* | 7/2003 | Graham | G06F 30/00 716/126 |
| 2012/0255388 | A1* | 10/2012 | McClosky | B25J 19/0025 74/490.02 |
| 2015/0059124 | A1* | 3/2015 | Stencel | F16C 1/102 16/2.1 |
| 2018/0272962 | A1* | 9/2018 | Lysik | B29C 48/06 |

(Continued)

FOREIGN PATENT DOCUMENTS

| CN | 206131923 | 4/2017 |
|---|---|---|
| EP | 2544110 | 1/2013 |

(Continued)

*Primary Examiner* — Eric S. McCall
(74) *Attorney, Agent, or Firm* — Burris Law, PLLC

(57) ABSTRACT

A method, system and apparatus for flexible component routing design, wherein a flexible component includes a first end and a second end, includes moving the second end relative to the first end to simulate an operational motion state of the flexible component, scanning the flexible component to obtain a first set of routing data for the flexible component, changing position of the second end from a first position to a second position, moving the second end relative to the first end to simulate an operational motion state of the flexible component, scanning the flexible component to obtain a second set of routing data for the flexible component, and comparing the first set of routing data with the second set of routing data to determine a routing design for the flexible component.

20 Claims, 13 Drawing Sheets

(56) References Cited

U.S. PATENT DOCUMENTS

| | | | |
|---|---|---|---|
| 2021/0022819 A1* | 1/2021 | Duque | A61B 34/35 |
| 2024/0149806 A1* | 5/2024 | Archer | A62C 27/00 |
| 2024/0149808 A1* | 5/2024 | Archer | A62C 27/00 |

FOREIGN PATENT DOCUMENTS

| | | |
|---|---|---|
| JP | 2005088692 | 4/2005 |
| KR | 101574287 | 12/2015 |

* cited by examiner

METHOD, SYSTEM AND APPARATUS FOR FLEXIBLE COMPONENT ROUTING DESIGN

CROSS-REFERENCE TO RELATED APPLICATIONS

This application claims priority to and the benefit of Chinese Application No. 2021102412345, filed on Mar. 4, 2021. The disclosure of the above application is incorporated herein by reference.

FIELD

The present disclosure relates to a method, system and apparatus for flexible component routing design.

BACKGROUND

The statements in this section merely provide background information related to the present disclosure and may not constitute prior art.

Flexible components are widely used in equipment such as vehicles, printers, machine tools and the like. Before practical application, routing design of the flexible components must be completed, so as to produce a flexible hose that can function in practical application based on the routing design. The routing design of flexible components usually relies on R&D experience and subjective judgment, and it takes a long time to try the feasibility of the routing design to find a final routing design solution. After virtual data is initially determined, a physical object verification test may also be carried out for physical object verification. If it is found that it does not meet requirements after the physical object verification test, it is necessary to re-manufacture a physical object and re-run the entire test process. This process will consume a lot of time and cost a lot.

SUMMARY

This section provides a general summary of the disclosure and is not a comprehensive disclosure of its full scope or all of its features.

The present disclosure should not be used to limit the claims. Other implementations are contemplated in accordance with the techniques described herein, as will be apparent to those of ordinary skill in the art upon examination of the following drawings and detailed description, and such implementations are intended to be within the scope of this application.

Inventors of the present disclosure have recognized that there is a need for a method, system and apparatus for flexible component routing design by which the flexible component routing design can be improved and the time and cost for the flexible component routing design can be reduced.

According to the present disclosure, there is provided a method for flexible component routing design, wherein: the flexible component includes a first end and a second end, and the method comprises:

moving the second end relative to the first end to simulate an operational motion state of the flexible component;

scanning the flexible component to obtain a first set of routing data for the flexible component;

changing position of the second end from a first position to a second position;

moving the second end relative to the first end to simulate an operational motion state of the flexible component;

scanning the flexible component to obtain a second set of routing data for the flexible component; and comparing the first set of routing data with the second set of routing data to determine a routing design for the flexible component.

According to one form of the present disclosure, the first and second set of routing data include one or more of the following: clearances between the flexible component and surrounding components, length of the flexible component, relative angle between the first and second ends of the flexible component, and bend radius of the flexible component.

According to one form of the present disclosure, the method further comprises:

connecting the second end to a first robot and connecting the first end to a bench; and obtaining routing data for the flexible component under different operational motion states through a scanning device connected to a second robot.

According to one form of the present disclosure, the second end is connected to the first robot through a fixed socket joint, and the first end is connected to a bracket on the bench through a movable socket joint.

According to one form of the present disclosure, the movable socket joint adjusts length of the flexible component by adjusting fixed position of the first end relative to the movable socket joint, and the movable socket joint adjusts relative angle between the movable and fixed socket joints by rotating about its axis.

According to one form of the present disclosure, the movable socket joint adjusts the length of the flexible component by moving the bracket, and the movable socket joint adjusts the relative angle between the movable and fixed socket joints by rotating about its axis.

According to one form of the present disclosure, the method further comprises: determining the first position, the second position, a third position up to an nth position, and respectively changing the position of the second end to the third position up to the nth position to obtain n sets of routing data.

According to one form of the present disclosure, the method comprises:

within a range of a sphere with connection position of the second end and the first robot as a center and a predetermined value as a radius:

exhaustively enumerating sites on the radius at predetermined intervals and respectively determining each of the sites as the first position, the second position, the third position up to the nth position.

According to another form of the present disclosure, the method comprises:

within a range of a sphere with connection position of the second end and the first robot as a center and a predetermined value as a radius:

simulating an operational motion state of the flexible component at a position corresponding to an intermediate site of the radius and obtaining routing data for the intermediate site of the flexible component;

obtaining routing data for at least one site on a first side of the intermediate site and comparing it with the routing data for the intermediate site;

if the routing data for the site on the first side is better, taking the site on the first side of the intermediate site as a new site range, and performing a routing data test; and if the routing data for the site on the first side is worse, obtaining routing data for at least one site on a second side opposite the first side and comparing it with the routing data for the intermediate site;

wherein the site corresponds to the first position, the second position, the third position up to the nth position.

According to one form of the present disclosure, the method further comprises: connecting the second end to a first robot 210 and obtaining routing data for the flexible component under different operational motion states through a scanning device connected to a second robot, wherein the first robot is further configured to position the second end of the flexible component to the first position, to the second position, and simulating motion of a vehicle when the second end is in the first position and the second position, respectively, so as to simulate the operational motion states of the flexible component, and the second robot is configured to cooperate with the first robot to obtain dynamic routing data for the flexible component during simulating the motion of the vehicle.

According to one form of the present disclosure, simulating the operational motion state of the flexible component comprises simulating an operational motion state when the flexible component is mounted on a vehicle, including: left and/or right turn, jumping up and/or down of wheels.

According to one form of the present disclosure, obtaining the first and second set of routing data comprises:

determining clearances between the flexible component and surrounding components based on the scan result;

determining whether the clearances meet requirements; and displaying the clearances that meet the requirements and/or the clearances that do not meet the requirements.

According to one form of the present disclosure, displaying the clearances that meet the requirements and the clearances that do not meet the requirements comprises: displaying the clearances that meet the requirements and the clearances that do not meet the requirements in a visually distinct manner.

According to one form of the present disclosure, the method further comprises:

providing the surrounding components;

disposing the surrounding components in a test environment; and disposing the flexible component in the test environment.

According to one form of the present disclosure, the method further comprises:

acquiring position data about the surrounding components based on vehicle virtual data.

According to one form of the present disclosure, the method further comprises:

filling the flexible component with fluid from the first or second end and keeping the fluid filled in the flexible component under a pressure for routing data tests under different operational motion states.

According to one form of the present disclosure, the method further comprises:

clamping the second end by a clamping member; and adjusting fixed position of the second end relative to the clamping member and/or rotation angle of the second end about itself.

According to yet another form of the present disclosure, there is provided a system for flexible component routing design, comprising:

a bench;

a first robot arranged on the bench and connected to a second end of the flexible component;

a second robot arranged on the bench and provided with a scanning device;

a bracket arranged on the bench and connected to a first end of the flexible component; and a computer connected to one or more of the first robot, second robot, and bracket, respectively, and including a processor and a memory, the memory storing processor-executable instructions that, when executed by the processor, cause the processor to:

moving the second end relative to the first end to simulate an operational motion state of the flexible component;
   scanning the flexible component to obtain a first set of routing data for the flexible component;
   changing position of the second end from a first position to a second position;
   moving the second end relative to the first end to simulate an operational motion state of the flexible component;
   scanning the flexible component to obtain a second set of routing data for the flexible component; and
   comparing the first set of routing data with the second set of routing data to determine a routing design for the flexible component.

According to one form of the present disclosure, the flexible component includes a fluid filled therein from the first or second end and keeps the fluid filled therein under a pressure for routing data tests under different operational motion states.

According to one form of the present disclosure, the flexible component comprises a brake hose.

According to the present disclosure, there is provided an apparatus for flexible component routing design, comprising a processor and a memory, the memory storing processor-executable instructions that, when executed by the processor, cause the processor to implement the steps of the method as previously described.

Further areas of applicability will become apparent from the description provided herein. It should be understood that the description and specific examples are intended for purposes of illustration only and are not intended to limit the scope of the present disclosure.

DRAWINGS

For a more complete understanding of the forms of the present disclosure, reference should be made to the forms illustrated in more detail in the accompanying drawings and described below by way of examples, in which.

Figure 1:
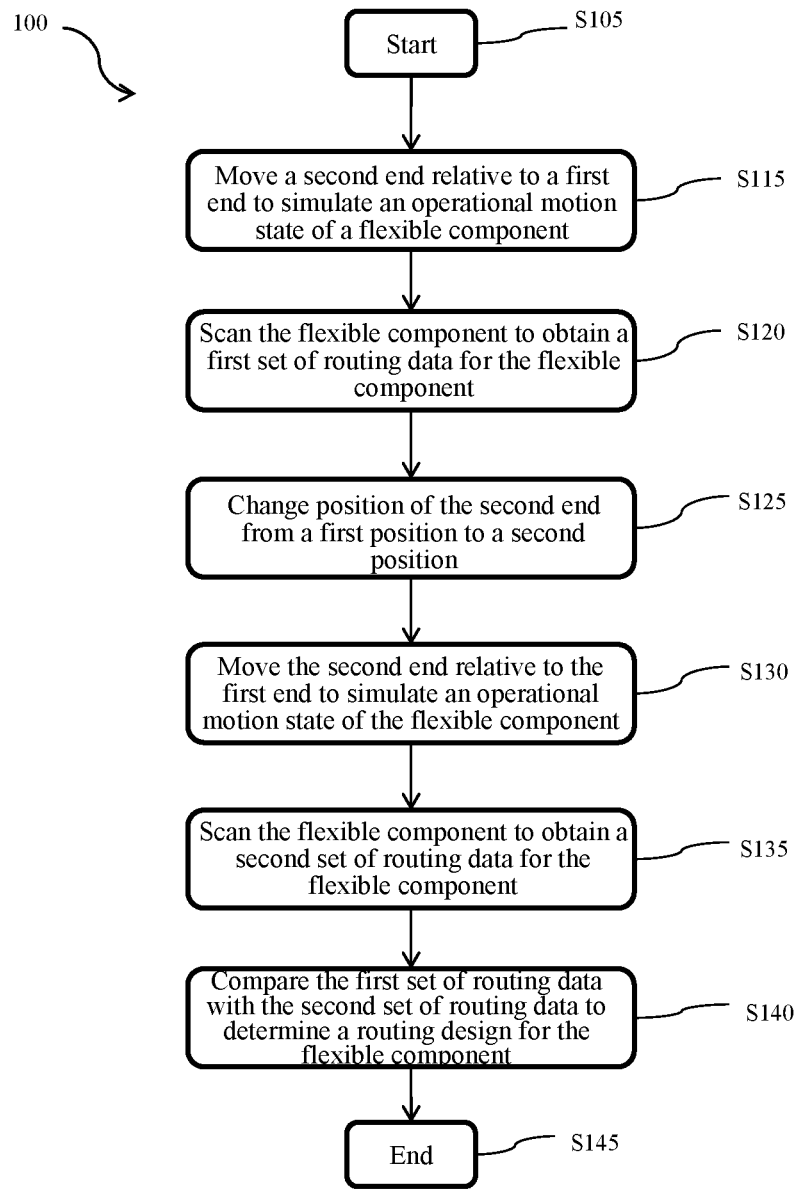
FIG. 1 is a flowchart of a method according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The forms of the present disclosure are described below. However, it should be understood that the disclosed forms are merely examples, and other forms may take various alternative forms. The drawings are not necessarily drawn to scale; some functions may be exaggerated or minimized to show details of specific components. Therefore, the specific structural and functional details disclosed herein should not be construed as restrictive, but merely serve as a representative basis for teaching those skilled in the art to use the present disclosure in various ways. As those of ordinary skill in the art will understand, the various features shown and described with reference to any one drawing can be combined with the features shown in one or more other drawings to produce forms that are not explicitly shown or described. The combinations of features shown provide representative forms for typical applications. However, various combinations and modifications to features consistent with the teachings of the present disclosure may be desirable for certain specific applications or implementations.

In addition, in this article, relational terms such as first and second are only used to distinguish one entity or action from another entity or action, and do not necessarily require or imply any actual such relationship or sequence between these entities or actions. The terms "comprise", "comprising" or any other variations thereof are intended to cover non-exclusive inclusion, so that a process, method, article or device comprising a series of elements includes not only those elements, but also those that are not explicitly listed or inherent in the process, method, article or device.

One or more forms of the present disclosure will be described below in conjunction with the drawings. The flowchart describes the process performed by the system according to the present disclosure. It can be understood that the execution of the flowchart does not need to be performed in sequence, one or more steps can be omitted, one or more steps can also be added, and one or more steps can be performed in sequential or reverse order, and even in some forms, can be performed simultaneously.

The flexible components involved in the following forms may include but are not limited to flexible or elastic cables, rubber tubes, wire harnesses, etc., or other flexible or elastic components that can be used in equipment such as vehicles, printers, machine tools, and the like. In one or more of the following forms, the present disclosure is described in the context of vehicle brake hose, however, it is to be understood that these forms are for illustrative purposes and are not intended to be limiting.

As mentioned in the background, the flexible components, such as wire harnesses, hoses, etc. generally need to be designed to be mounted to the corresponding equipment, so as to provide that the flexible components have an improved routing during operational motion, and do not interact or interfere with surrounding components, etc. Generally speaking, the routing design of flexible components usually relies on R&D experience and subjective judgment. There is some software in the prior art that can provide a range of approximate feasible solutions. In practice, it still takes a long time to try the feasibility of the flexible component routing design to find a final routing design solution. After subsequent virtual data is determined, some manufacturers will further conduct repeated verification on physical object. If it is found that it does not meet requirements after verification, it is necessary to re-manufacture a physical object and re-run the entire physical object verification process. This process will consume a lot of time and cost a lot. In addition, the inventors of the present disclosure found that even if the verified design is determined to meet the requirements, the design is not necessarily a desirable routing. Therefore, the inventors of the present disclosure provide, in one or more forms, a method, system and apparatus for improving flexible component routing design.

Figure 2:
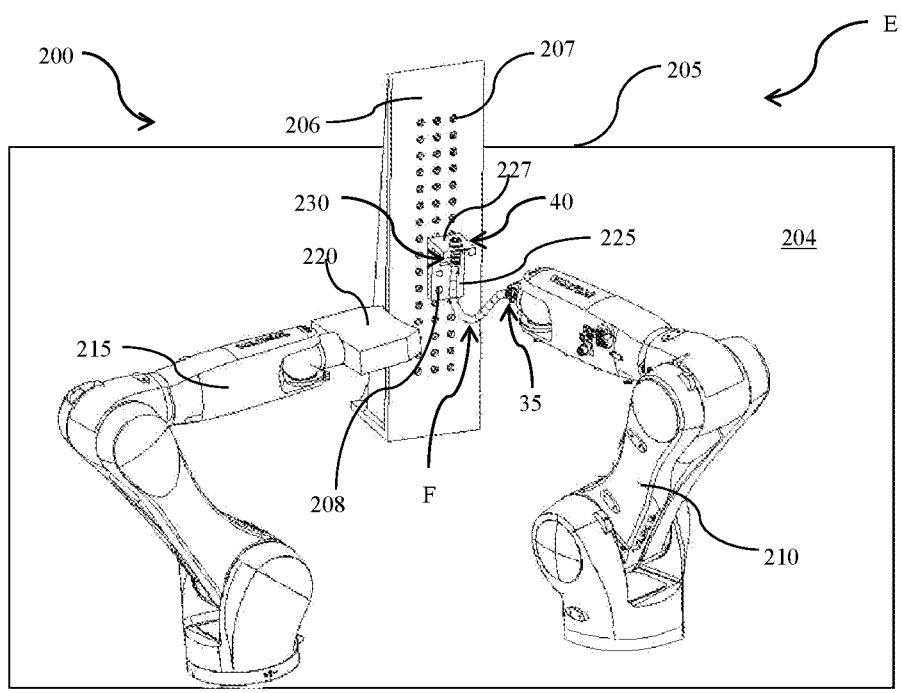
FIG. 2 is a schematic view of a system according to the present disclosure.
Figure 3:
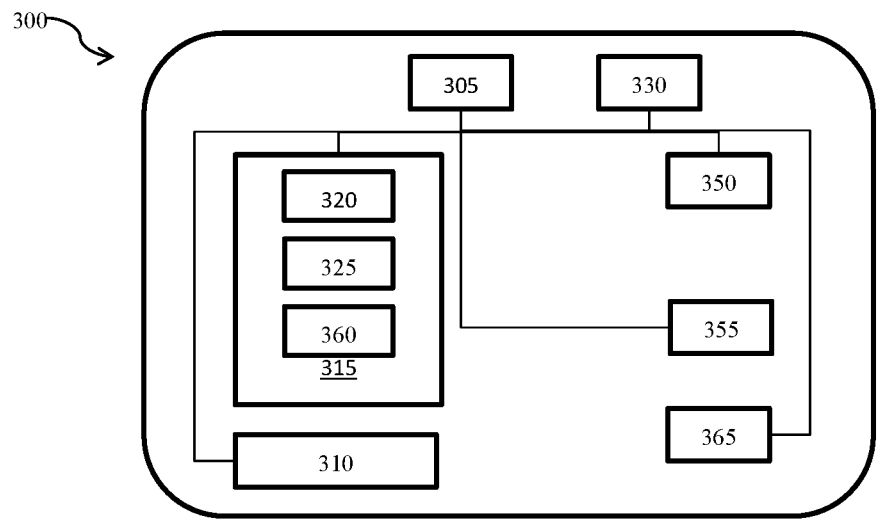
FIG. 3 is a schematic diagram of a computer according to the present disclosure.

In order to improve flexible component routing design, and reduce the time and cost for flexible component routing design, in one form, the present disclosure provides a method 100 for flexible component routing design. Wherein the flexible component F described herein may include a first end 40 and a second end 35 (as shown in FIG. 2). As shown in FIG. 1, the method 100 of the present disclosure may start at S105 and comprise: S115, moving the second end 35 relative to the first end 40 to simulate an operational motion state of the flexible component F; S120, scanning the flexible component F to obtain a first set of routing data for the flexible component F; S125, changing position of the second end 35 from a first position to a second position; S130, moving the second end 35 relative to the first end 40 to simulate an operational motion state of the flexible component F; S135, scanning the flexible component F to obtain a second set of routing data for the flexible component F; S140, comparing the first set of routing data with the second set of routing data to determine a routing design of the flexible component F; and the method 100 ends at S145. In addition, in another form, the present disclosure also provides a system 200 for flexible component routing design. As shown in FIG. 2, the system 200 may comprise: a bench 205; a first robot 210, which can be arranged on the bench 205 and connected to a second end 35 of the flexible component F; a second robot 215, which can be arranged on the bench 205 and provided with a scanning device 220; a bracket 225, which can be arranged on the bench 205 and connected to a first end 40 of the flexible component F; and a computer 300. As shown in FIG. 3, the computer 300 can be connected to one or more of the first robot 210, the second robot 215, and the bracket 225, respectively, and can include a processor 305 and a memory 310, the memory 310 may store instructions executable by the processor 305 that, when executed by the processor, cause the processor to implement the steps of the method 100 described herein.

In the form shown in FIG. 2, the bench 205 and the first robot 210, the second robot 215 and the bracket 225 arranged on the bench 205 may be disposed in a test environment E. The bench 205 may be any bench or working table suitable for performing operations on the routing design of the flexible component F, and the bench 205 may have the first robot 210, the second robot 215 and the bracket 225 arranged thereon by means of fixed or slidable connections conventional in the art. In one form, the bench 205 may include at least one fixing portion (e.g., a mounting hole formed in the bench 205, not shown) for receiving a fastener (e.g., a bolt), by which the components to be arranged on the bench 205 are fixed on the bench 205. The first robot 210 can be fixedly installed on the bench 205 and can be configured to move together with the flexible component F connected thereto within a spatial range of the test environment E to simulate the operational motion states of the flexible component F. The second robot 215 may be fixedly installed on the bench 205 and configured to cooperate with the first robot 210 to obtain the routing data for the flexible component F during simulating the operational motion states of the flexible component F. The bracket 225 can be fixedly mounted on the bench 205 or arranged on the bench 205 in a sliding manner relative to the bench 205. In one form of the present disclosure, the bracket 225 may be arranged on the bench 205 by additional means. In the form shown in FIG. 2, the bracket 225 may be arranged on the bench 205 by a fixing device 206 fixedly mounted on the bench 205. The fixing device 206 may include at least one mounting hole 207, and correspondingly, the bracket 225 may include at least one mounting hole 208. As shown in FIG. 2, the fixing device 206 may include 48 mounting holes 207, and the combination of the mounting holes 208 and the mounting holes 207 at different positions on the fixing device 206 can realize the fixing of the bracket 225 relative to the fixing device 206 at different positions. In another form of the present disclosure, the bracket 225 may be arranged on the bench 205 by a sliding mechanism (not shown) disposed on or in a table top 204 of the bench 205, and thus the movable arrangement of the bracket 225 on the bench 205 can be realized. In other forms of the present disclosure, the bracket 225 can be directly arranged on the bench 205 without any additional device. It should be understood by those skilled in the art that, although the specific structure of the fixing device 206 and the specific structure and number of the mounting holes 207 and 208 are shown in the form of FIG. 2, it should be understood that this form is for illustrative purposes and is not intended to be limiting, other structures of fixing devices and/or other numbers and structures of mounting holes or other structures that can be used for connection are also within the scope of the concept of the present disclosure.

Figure 4:
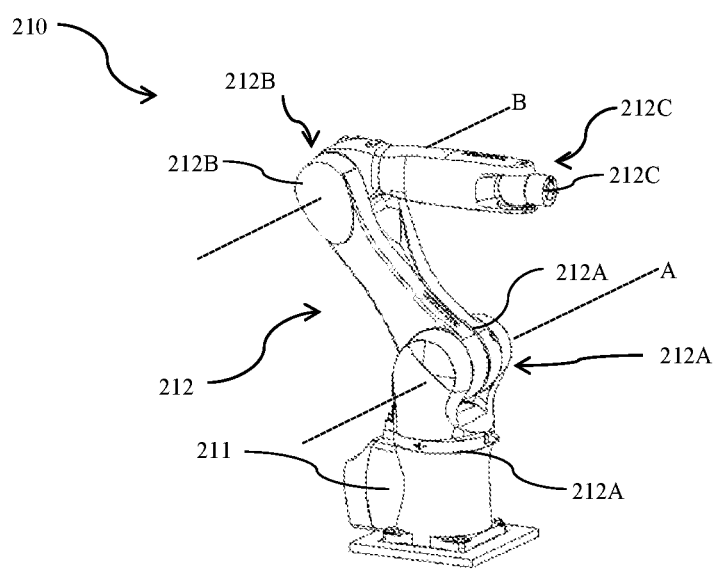
FIG. 4 is a perspective view of a first robot according to the present disclosure.

Referring to FIG. 4, a schematic diagram of the first robot 210 according to one form of the present disclosure is shown. The first robot 210 may include a fixing portion 211 and a robotic arm 212 connected with the fixing portion 211. The fixing portion 211 may be mounted on the bench 205 via, for example, bolting. The robotic arm 212 may be provided on the fixing portion 211 and include a first operating portion 212A, a second operating portion 212B and a third operating portion 212C. In the form of the present disclosure, the first operating portion 212A may be configured to move the robotic arm 212 up and down and/or rotate the robotic arm 212 at any angle. For example, in the form shown in FIG. 4, the first operating portion 212A may include a rotating portion 212A' configured to be able to rotate at any angle relative to the fixing portion 211 and a pivoting portion 212A" configured to enable the robotic arm 212 to pivot along an axis A. In other forms, the first operating portion 212A may include a universal joint, around which the robotic arm 212 can rotate at any angle. In the form of the present disclosure, the second operating portion 212B may be configured to move the robotic arm 212 up and down. For example, in the form shown in FIG. 4, the second operating portion 212B may include a pivoting portion 212B' configured to enable the robotic arm 212 to pivot along an axis B. In other forms, the second operating portion 212B may also include a universal joint, around which the robotic arm 212 can rotate at any angle. In a form of the present disclosure, the third operating portion 212C may be configured to be connected with at least a part of the flexible component F. In the form shown in FIG. 4, the third operating portion 212C may include a receiving portion 212C', which may be connected with, for example, the first or second end of the flexible component F, and may be rotated relative to the robotic arm 212 at any angle. In other forms, the third operating portion 212C may also include a universal joint, so that the receiving portion 212C' can be rotated at any angle relative to the robotic arm 212.

Figure 5:
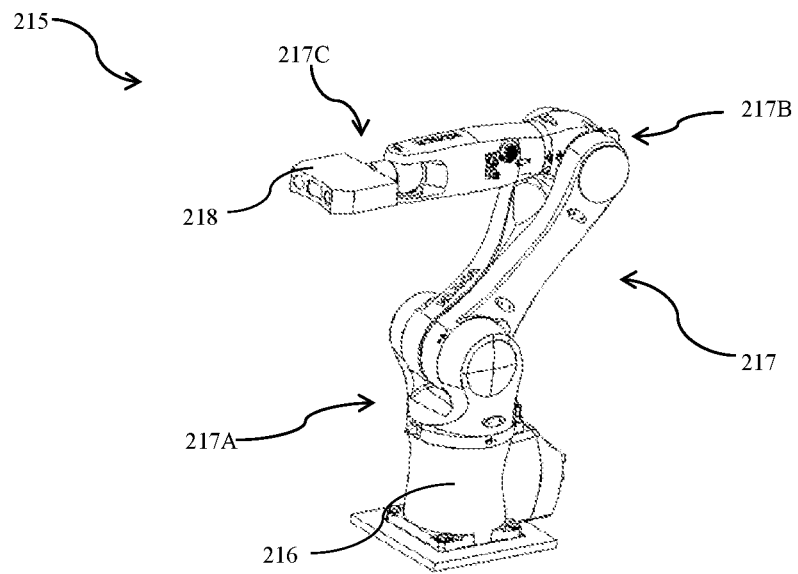
FIG. 5 is a perspective view of a second robot according to the present disclosure.

Referring to FIG. 5, a schematic diagram of the second robot 215 according to a form of the present disclosure is shown. The second robot 215 may have substantially the same structure as the first robot 210. For example, the second robot 215 may include a fixing portion 216 and a robotic arm 217 connected with the fixing portion 216. The robotic arm 217 may be disposed on the fixing portion 216 and includes a first operating portion 217A, a second operating portion 217B and a third operating portion 217C. The first operating portion 217A, the second operating portion 217B and the third operating portion 217C may have similar structures and functions as the first to third operating portions of the first robot 210. Different from the first robot 210, the third operating portion 217C may be configured to be connected to a scanning device 218. The scanning device 218 may be an automatically controlled scanner or other devices capable of automatic data collection. The third operating portion 217C may further include a universal joint (not shown), through which the scanning device 218 can rotate at any angle relative to the robotic arm 217.

Those skilled in the art can understand that, although the first and second robots shown in the forms of FIGS. 4 and 5 employ substantially the same structure, the first and second robots can employ completely different structures in other forms, and at least one of the first and second robots can also be replaced by other adjustment devices that can realize any angle rotation and one or more of up and down, left and right movements in the test environment E in another form. Such adjustment devices may, for example, comprise one or more levers that can be provided on the bench 205 and a movable pivot or universal joint provided on the levers. In addition, the first and second robot can realize automatic control. For example, the first and second robot may be automatically controlled by the computer 300 based on a preset program or according to a user-customized program.

Returning to FIG. 3, a schematic diagram of the computer 300 according to one form of the present disclosure is shown. The computer 300 may vary greatly due to different configurations or performances. In the form shown in FIG. 3, the computer 300 may include a processor 305 and a memory 310. Alternatively, or additionally, the computer 300 may include one or more storage media 315 (e.g., one or more mass storage devices) that store applications 320 and/or data 325 (e.g., the data 325 may include the routing data for the flexible components described herein). The memory 310 and the storage media 315 may include volatile and non-volatile memories such as read only memory (ROM), random access memory (RAM), and keep alive memory (KAM). Any number of known storage devices, such as programmable read only memory (PROM), EPROM (electrically programmable read only memory), EEPROM (electrically erasable programmable read only memory), flash memory, or any other electronic, magnetic, optical, or combined storage devices capable of storing data, may implement the memory 310 and the storage media 315. The memory 310 and the storage media 315 may store, for example, instructions executable by the processor 305 of the computer 300. The computer 300 may also include a power supply 330, a wired or wireless network interface 350, an input-output interface 355, an operating system 360, and/or a display 365. The computer 300 may be connected to one or more other components in the system 200 through the wired or wireless network interface 350, and may input or output the data 325 through the input-output interface 355. Additionally, the data 325 may be displayed via the display 365. The applications 320 may include software or modules related to flexible component routing design, such as IPS (Industrial Routing Solution), CATIA (Computer-graphics Aided Three-dimensional Interactive Application) and the like.

The flexible component F of the present disclosure can be applied to equipment such as vehicles, printers, machine tools and the like, and both ends of the flexible component F can be connected to corresponding parts in these pieces of equipment. In the application process, it is desirable to provide that the flexible component F can function normally, so the routing design of the flexible component F needs to be carried out to find a desired routing design scheme. Under the concept of the present disclosure, non-limiting examples of factors that may affect the normal functioning of the flexible component F may include one or more of the following: clearances between the flexible component F and surrounding components, length of the flexible component F, bending radius of the flexible component F and self-twisting of the flexible component F about its own axis, in other words, a relative angle between the two ends of the flexible component F, as described elsewhere in this application. In addition, in the form in which the flexible component F includes a flexible tube, such as but not limited to a brake hose, the operational state of the brake hose also includes filling state of the brake fluid. In order to better simulate routing under different situations, in one form of the present disclosure, the method 100 may further include filling fluid into the flexible component F from one of the two ends of the flexible component F and keeping the fluid filled into the flexible component F under a pressure for routing data tests of the flexible component F under different operational motion states.

The system 200 can also include a clamping member 230 (shown in FIG. 2), which can be used to clamp the first end 40 and/or the second end 35 of the flexible component F. In one form of the present disclosure, the flexible component F may be connected to the first robot 210 and/or the second robot 215 through the clamping member 230.

Figure 6A:
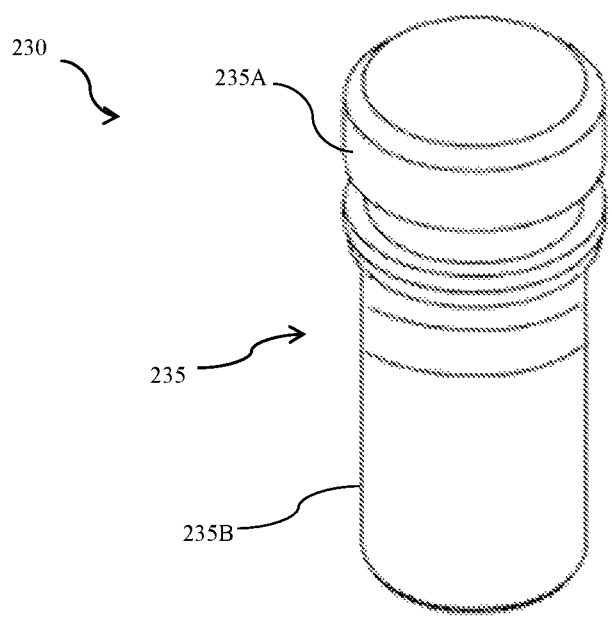
FIG. 6A is a perspective view of a clamping member according to one form of the present disclosure.

The clamping member 230 may include a fixed socket joint 235, as shown in FIG. 6A. The fixed socket joint 235 may include a first socket end 235A and a second socket end 235B. In one form of the present disclosure, the first socket end 235A may be used to connect, for example, the first robot 210 or the bracket 225, and the second socket end 235B may be used to connect the first end 40 or the second end 35 of the flexible component F. For example, the first end 40 or the second end 35 of the flexible component F can be inserted into the second socket end 235B and secured by, for example, screws; and the first socket end 235A can be inserted and secured into the receiving portion 212C' as described above or secured into the bracket 225 containing a corresponding receiving portion (not shown). It should be understood by those skilled in the art that although the form shown in FIG. 6A shows that the first socket end 235A and the second socket end 235B are in the same horizontal line, the first socket end 235A and the second socket end 235B can be arranged perpendicular to each other or at any angle to each other according to actual needs.

Figure 6B:
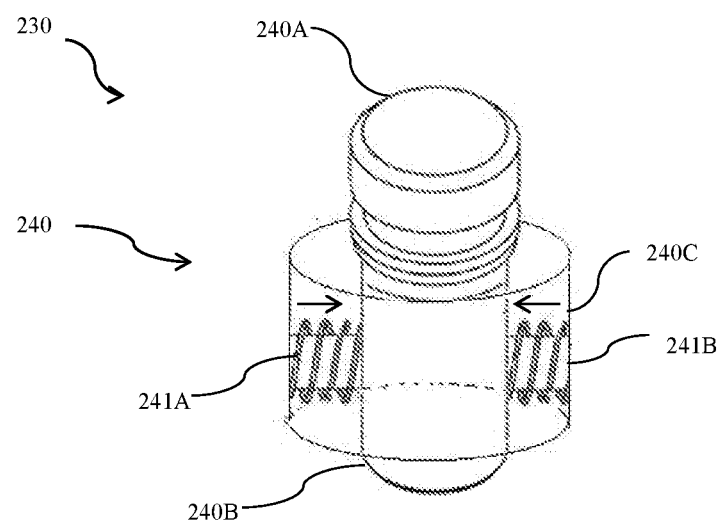
FIG. 6B is a perspective view of a clamping member according to another form of the present disclosure.

The clamping member 230 may include a movable socket joint 240, as shown in FIG. 6B. The movable socket joint 240 may include a first socket end 240A, a second socket end 240B, and a clamping device 240C. In one form of the present disclosure, the first socket end 240A may be used to connect, for example, the first robot 210 or the bracket 225, and the second socket end 240B may be used to connect the first end 40 or the second end 35 of the flexible component F. For example, the first end 40 or the second end 35 of the flexible component F can be inserted into the second socket end 235B and secured by the clamping device 240C. The clamping device 240C can be configured to be releasable, for example, the clamping device 240C can have elastic elements (elastic elements 241A and 241B are schematically shown in the figure), which can apply a clamping force in the direction indicated by the arrow to the first end 40 or the second end 35 of the flexible member F clamped therein. In one form, the first socket end 240A and the second socket end 240B may be in communication, and when the clamping device 240C is released, the length of the flexible component F may be adjusted by automatically extracting the first end 40 or the second end 35. In another form, after the clamping device is released, the length of the flexible component F may be adjusted by adjusting the fixed position of the first end 40 or the second end 35 of the flexible component F relative to the movable socket joint 240 (e.g. the fixed position relative to the second socket end 240B), thereby realizing the routing design for the flexible component F of different lengths, so as to determine the desired length of the flexible component. The first socket end 240A may be inserted and secured into the receiving portion 212C' as described above or secured into the bracket 225 containing a corresponding receiving portion (not shown). In the form shown in FIG. 2, the first socket end 240 may be, for example, snapped to an extension portion 227 of the bracket 225. In addition, the movable socket joint 240 can also be rotated about its axis, so that when the flexible component F is connected to the system 200 by two movable socket joints 240, or one movable socket joint 240 and one fixed socket joint 235, the relative angle between the movable socket joint 240 and the movable socket joint 240, or the relative angle between the movable socket joint 240 and the fixed socket joint 235 can be adjusted. In one form of the present disclosure, by using the movable socket joint 240, the length and angle of the first end 40 or the second end 35 of the flexible component F can be adjusted. Furthermore, although the clamping device is shown in the form of a coil spring in the form of FIG. 6B, the clamping device could also be a leaf spring; or alternatively, the clamping device could also be a releasable threaded fastener. Those skilled in the art can understand that, without departing from the spirit of the present disclosure, the movable socket joint can have various structural variants, as long as the relative rotation and movement of the ends of the clamping member can be achieved, such as clamping can be done by applying a spring force with a spring member around the flexible component. In another variant, a certain end can also be fixed by a metal joint, the metal joint can be adsorbed by electromagnetic force realized by low-current energization, the stepping action of the clamped end can be achieved by selectively cutting off the current, and the fastening can be achieved by restoring the electromagnetic force. In yet another variant, the relative fixation can be achieved by means of resilient jaws extending circumferentially inwards. In yet another variant, the fixation can be achieved by a gear and a fixed sleeve with a rack, for example by turning one tooth of the gear to move the fixed sleeve with the rack by a step distance (e.g., 2 mm). The above are non-limiting examples, and those skilled in the art will readily recognize other variations.

Figure 14A:
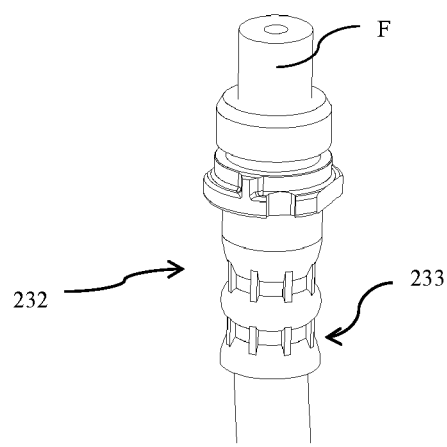
FIG. 14A shows a schematic diagram of an adjustable joint according to some forms of the present disclosure.

Alternatively, the present disclosure may not include the clamping member 230 as described above, and the flexible component F may be connected to the bracket 225 through an adjustable joint 232, as shown in FIG. 14A. A schematic diagram of the flexible component F extending through the adjustable joint 232 is shown in FIG. 14A. It is readily understood that the adjustable joint 232 can move up and down relative to the flexible component F, and can rotate relative to the flexible component F. The adjustable joint 232 may include an adjustment portion 233, on which at least one mounting member (e.g., a mounting hole, not shown) for receiving a fastener (e.g., a bolt, not shown) may be provided. The flexible component F can be fixed when the fastener is received in the mounting member (e.g., the bolt is tightened); and the length of the flexible component F can be adjusted by extracting the end of the flexible component F when the fastener is at least partially not received in the mounting member (e.g., the bolt is loosened). After the length of the flexible component F is adjusted, the flexible component F with the adjustable joint 232 may be attached to the bracket 225, such as snapped to the extension portion 227 of the bracket 225 as described above, or connected to the receiving portion of the bracket 225. It should be understood that the length of the flexible component F can be adjusted by the method described in this application at any time required during the routing design test.

Figure 14B:
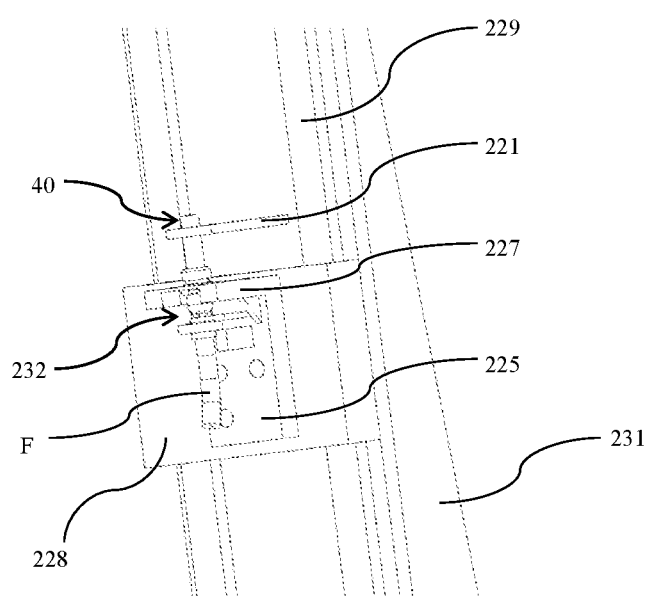
FIG. 14B is a perspective view of a flexible component F with an adjustable joint according to some forms of the present disclosure.

Referring to FIG. 14B, a schematic diagram of another form of the flexible component F with an adjustable joint 232 is shown. For illustrative purposes, only a portion of the flexible component F is shown. As shown, the flexible component F with the adjustable joint 232 is connected to the extension portion 227 of the bracket 225, the bracket 225 can be connected to a fixing device 231 that can be arranged on the bench 205 (not shown). In the form of FIG. 14B, the bracket 225 can be slidably engaged with a rail 229 provided on the fixing device 231 through a sliding member 228, and thus the sliding engagement of the flexible component F relative to the fixing device 231 can be realized. One end (e.g., the first end 40) of the flexible component F can be fixed on the fixing device 231 by a fixing member 221. With the first end 40 of the flexible component fixed, the length of the flexible component F can be adjusted by sliding an adjustment portion (not shown) of the adjustable joint 232 and the bracket 225 together with the flexible component F relative to the fixing device 231 through the sliding member 228. In one form, when the fasteners in the mounting part of the adjustment portion are loosened, the bracket 225 and the flexible component F are slid relative to the fixing device 231, and the length of the flexible component F to be routed can be selected. Although the case where the length of the first end 40 is adjustable is given in this form, under the concept of the present disclosure, the second end 35 is also applicable.

Figure 7:
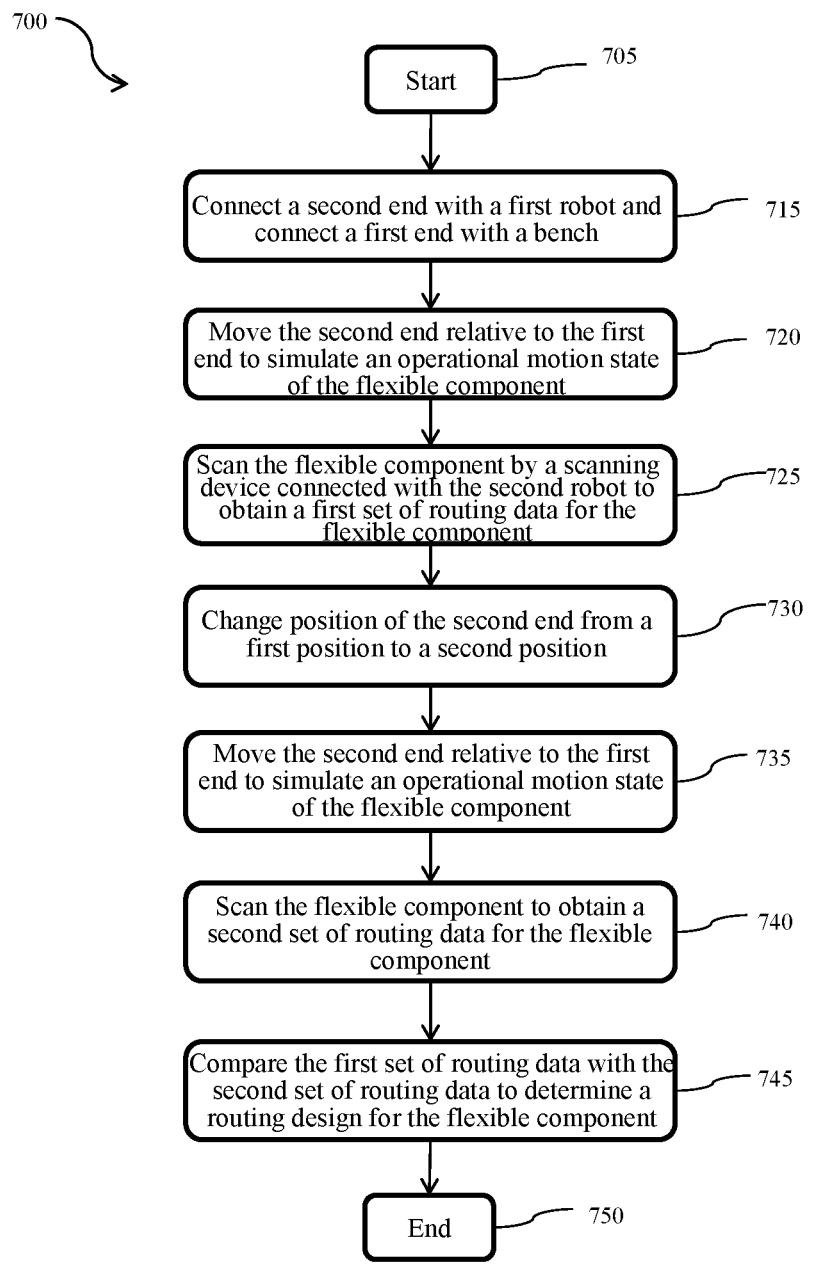
FIG. 7 is a flowchart of a method according to the present disclosure.

Referring to FIG. 7 on the basis of referring to FIG. 2, a schematic diagram of a method 700 according to a specific form of the method 100 of the present disclosure is shown.

The method 700 may start at block 705. For example, the method 700 may start in response to a need for routing design of the flexible component F.

Next in block 715, the second end 35 of the flexible component F is connected to the first robot 210 and the first end 40 of the flexible component F is connected to the bench 205. In one form of the present disclosure, the first end 40 and the second end 35 of the flexible component F may be clamped by the clamping member 230 as described above. For example, the first end 40 can be clamped by the movable socket joint 240 and the second end 35 can be clamped by the stationary socket joint 235, or vice versa. It is also possible to use either the movable socket joint 240 or the fixed socket joint 235 for both the first end 40 and the second end 35. For example, the first end 40 or the second end 35 may be secured to the fixed socket joint 235 via a crimping process. And then, the second end 35 is connected to the first robot 210, and the first end 40 is connected to the bench 205.

In the form shown in FIG. 2, the second end 35 can be connected to the first robot 210 through the fixed socket joint 235, and the first end 40 can be connected to the bracket 225 on the bench 205 through the movable socket joint 240. As described above, since the clamping device of the movable socket joint 240 is releasable, the length of the flexible component F can be adjusted by adjusting the fixed position of the first end 40 relative to the movable socket joint 240, and the movable socket joint 240 can be rotated about its own axis to adjust the relative angle between the movable joint 240 and the fixed socket joint 235.

Next in block 720, the second end 35 is moved relative to the first end 40 to simulate an operational motion state of the flexible component F. In a form of the present disclosure, the simulation of the operational motion state of the flexible component F can be realized by the first robot 210. For example, the flexible component F can be moved up and down, left and right and/or rotated at any angle in the test environment E through the movement of the robotic arm of the first robot 210 (e.g., moving at least one of the first operating portion 212A, the second operating portion 212B and the third operating portion 212C).

In block 725, the flexible component F is scanned by the scanning device 220 connected to the second robot 215 to obtain a first set of routing data for the flexible component F in the process of simulating the operational motion state of the flexible component F. In some forms of the present disclosure, the route data in the present disclosure including the first set of route data and the second set of route data described below may include one or more of the following: clearances between the flexible components F and surrounding components, length of the flexible component F, relative angle between the first end 40 and the second end 35 of the flexible component F, and bending radius of the flexible component F and other data. In another or more forms, the routing data including the above-mentioned first set of routing data and the second set of routing data also includes a comparison result with a preset value. For example, in a non-limiting example, if test data is 10 mm and the preset value is 8 mm, the display of the routing data may be +2 mm. And if the preset value is 12 mm, the display of the routing data may be −2 mm. These data can be presented in similar different colours or other visual effects.

Next in block 730, the position of the second end 35 is changed from the first position to the second position. In some forms of the present disclosure, the first end 40 and the second end 35 of the flexible component may be positioned at various positions in the test environment E, which may, for example, correspond to the actual installation position of the flexible component F in the equipment in which it is applied. In one form, approximate positions of the first end 40 and the second end 35 of the flexible component F in the test environment E can be pre-estimated by software related to routing design (e.g. IPS) in combination with the actual application of the flexible component F, the respective first positions of the first end 40 and the second end 35 of the flexible component F are then determined according to the approximate positions, and the second end 35 is positioned to the first position of the second end 35 by the first robot 210, and the first end 40 is positioned to the first position of the first end 40 by the bracket 225. For the first position of the second end 35, the first robot 210 can simulate the operational motion state of the flexible component F by moving, and then obtain the first set of routing data for the flexible component F corresponding to the first position. Next, the first robot 210 positions the second end 35 from the first position to the second position by moving its robotic arm, in which case the first position of the first end 40 may remain unchanged. However, in other forms, the first end 40 may be positioned to the second position by moving the position of the bracket 225 relative to the bench 205 as desired. Then, in block 735, for the second position of the second end 35, the second end 35 is moved relative to the first end 40 to simulate the operational motion state of the flexible component F. The flexible component F is scanned in block 740 to obtain a second set of routing data for the flexible component F, e.g., to obtain a second set of routing data for the flexible component F corresponding to the second position. In block 745, the first set of routing data is compared with the second set of routing data to determine a routing design for the flexible component F. As previously mentioned, both the first and second set of routing data may include, for example, clearances between the flexible component F and surrounding components, length of the flexible component F, relative angle between the first end 40 and the second end 35 of the flexible component F, and bending radius of the flexible component F and other data. By comparing which one of the first and second set of routing data is more in line with the requirements, a better routing design for the flexible component can be determined.

Thereafter, the method 700 ends in block 750.

In another alternative to the method 700, as an alternative to the step of block 745, after block 740, the first robot 210 may position the second end 35 from the second position to a third position by moving its robotic arm, and then obtain a third set of routing data of the flexible component F corresponding to the third position . . . . In a similar fashion, until an nth set of routing data corresponding to an nth position of the flexible component F is obtained. In this case, the method 700 may further include the step of comparing the first set of routing data to the nth set of routing data to determine a routing design for the flexible component.

In one form of the present disclosure, the above-mentioned first position, second position . . . up to the nth position at which the second end 35 of the flexible component F is positioned in the test environment E can be determined by an algorithm, for example, which can include an exhaustive or dichotomy method, as described elsewhere in this application.

Alternatively, or additionally, the method 700 may further comprise the step of displaying the routing data for the flexible component F. In one form of the present disclosure, one or more sets of routing data including the first set of routing data, the second set of routing data . . . up to the nth set of routing data may be displayed through the display 365 as described above. In addition, the route data that meet the requirements and the route data that do not meet the requirements can be displayed in a visually distinct manner. For example, the route data that meet the requirements can be displayed in green, and the route data that do not meet the requirements can be displayed in red. For another example, the route data that do not meet the requirements may be displayed in a blinking manner relative to the route data that meet the requirements. For another example, the deviation of the routing data from the preset value can be displayed in different visual ways. In other forms, the data that does not conform to the preset value range can be directly filtered. Alternatively, or additionally, the method 700 may also include the step of selecting the routing data. For example, the method 700 can automatically filter out more preferred route data from multiple sets of route data that meet the requirements, and display the preferred route data. This is especially useful when the amount of data is very large.

In some forms of the present disclosure, whether the routing data meet requirements can be determined by at least one of the following factors: whether the clearances between the flexible component F and the surrounding components is greater than a threshold; whether the length of the flexible component F is within a threshold range; whether the relative angle between the first and second end of the flexible component F is greater than a threshold; and whether the bending radius of the flexible component F is greater than a minimum bending radius. In the presence of multiple factors, priority can be set among multiple factors. In one form of the present disclosure, the priority of multiple factors may be: the clearances between the flexible component F and the surrounding components>the length of the flexible component F>the relative distance between the first and second section of the flexible component F>the bending radius of flexible component F. In further forms, the priority of multiple factors may be: the clearances between the flexible component F and the surrounding components>the bending radius of the flexible component F>the relative distance between the first and second end of the flexible component F>the length of flexible component F. In other forms, there may also be prioritization of any of the above-mentioned factors. For example, in the case where the clearances between the flexible component F and the surrounding components is the highest priority, if the clearances range that meet the requirements is 10~30 mm, the clearances range can be divided into, for example, 10~15 mm, 15~20 mm, 20~30 mm, or even more than 30 mm, for example, a range of 20~30 mm can be selected to further investigate whether the bending radius as the second priority meet the requirements; and then the bending radius that meet the requirements can be divided, and then one of the ranges (if there are multiple sets of bending radius that meet the requirements) can be selected to further investigate the relative angle between the first and second end of the flexible component F as the third priority, and the rest can be done in the same manner.

In one form of the present disclosure, the above-mentioned thresholds or threshold ranges for the clearances, length, relative angle, and bending radius may be obtained empirically and stored in the system 200 (e.g., the computer 300 of the system 200) in advance. Alternatively, these thresholds can be obtained by machine learning. Further, these thresholds may be dynamic and may vary according to the actual application equipment of the flexible component F. In addition, the thresholds or threshold ranges can also be dynamically changed according to different operating conditions of the actual application equipment, in a first operating condition, the threshold can correspond to a first threshold or threshold range, and in a second operating condition, and the threshold can correspond to a second threshold or threshold range. For example, in the case where the actual application equipment is vehicle, the first operating condition may be, for example, a standard driving condition, in which the vehicle may experience minor bumps and/or normal steering; the second operating condition may be, for example, extreme conditions, in which the vehicle may experience extreme bumps and/or extreme steering. In the case of the first operating condition, for example, the threshold range for the clearances may be set to be above 25 mm or above 30 mm; and in the case of the second operating condition, for example, the threshold range for the clearance may be set to 15-20 mm.

It can be understood that the above-mentioned comparison of the scanned routing data for the flexible component with the threshold clearances can be achieved by directly comparing each routing data with the threshold clearances, and can also be achieved by constructing an envelope of the desired threshold clearances and comparing the scanned data for the flexible component with the constructed envelope in another form. If the scanned data for the flexible component goes beyond the envelope, it will be set as unqualified. If the scanned data for the flexible component is within the envelope, it will be set as qualified.

Figure 8A:
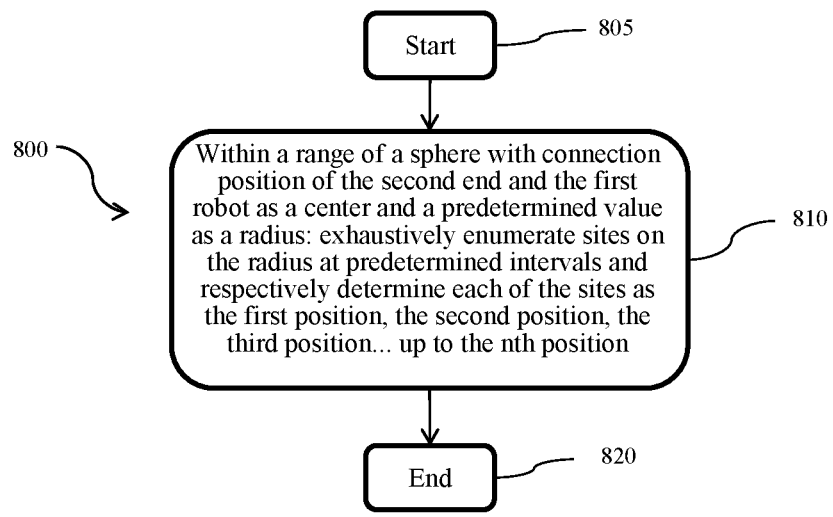
FIG. 8A is a flowchart of a method according to some forms of the present disclosure.
Figure 8B:
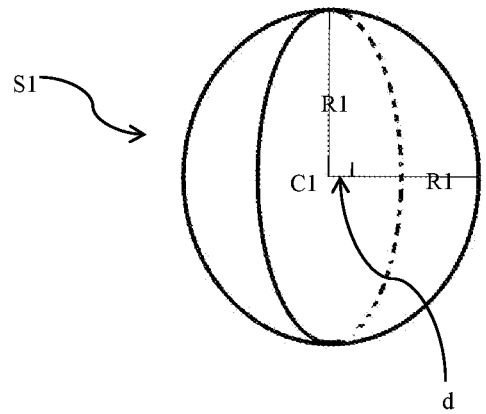
FIG. 8B is a schematic diagram of a sphere according to some forms of the present disclosure.

Referring to FIGS. 8A and 8B, FIG. 8A shows a schematic diagram of a method 800 according to a specific form of the method 100 of the present disclosure, and FIG. 8B shows a schematic diagram of a sphere S1 related to the method 800. In the form shown in FIG. 8A, the first position, the second position . . . up to the nth position of the second end 35 of the flexible component F in the test environment E can be determined using an exhaustive method.

As shown in FIG. 8A, the method 800 may start at block 805. For example, the method 800 may start in response to a need to determine the first position, the second position . . . up to the nth position of the flexible component F in the test environment E.

In block 810, within a range of the sphere S1 with connection position of the second end 35 of the flexible component F and the first robot 210 as a center C1 and with a predetermined value as a radius R1: sites on the radius R1 at predetermined intervals are exhaustively enumerated and each site are determined as the first position, the second position, the third position, . . . up to the nth position, respectively.

In a form of the present disclosure, the sphere S1 can be as shown in FIG. 8B, wherein the position of the center in the test environment E and the predetermined value of the radius R1 can be pre-estimated via a software related to routing design (e.g., IPS). In the case where the second end 35 and the first robot 210 are connected by the clamping member 230, the clamping position can also be regarded as the connection position of the second end 35 and the first robot 210. In the form shown in FIG. 8B, the sites on R1 can be exhaustively enumerated at a predetermined interval d starting from the center C1. Although only two radii of the sphere S1 are shown, under the concept of the present disclosure, the sites on each radius will be exhaustively enumerated at the predetermined interval d. In a form of the present disclosure, the predetermined interval d may be obtained empirically and stored in the system 200 (e.g., the computer 300 of the system 200) in advance. In one form, the predetermined range of the predetermined interval d may be 1 mm to 3 cm. In a specific form, the predetermined interval d is in the range of 5 mm to 1 cm. Alternatively, the predetermined range of the predetermined interval d may be obtained by machine learning. Further, the predetermined range of the predetermined interval d may be dynamic, and may be changed according to the actual application equipment of the flexible component F.

The method 800 ends in block 820.

Figure 9A:
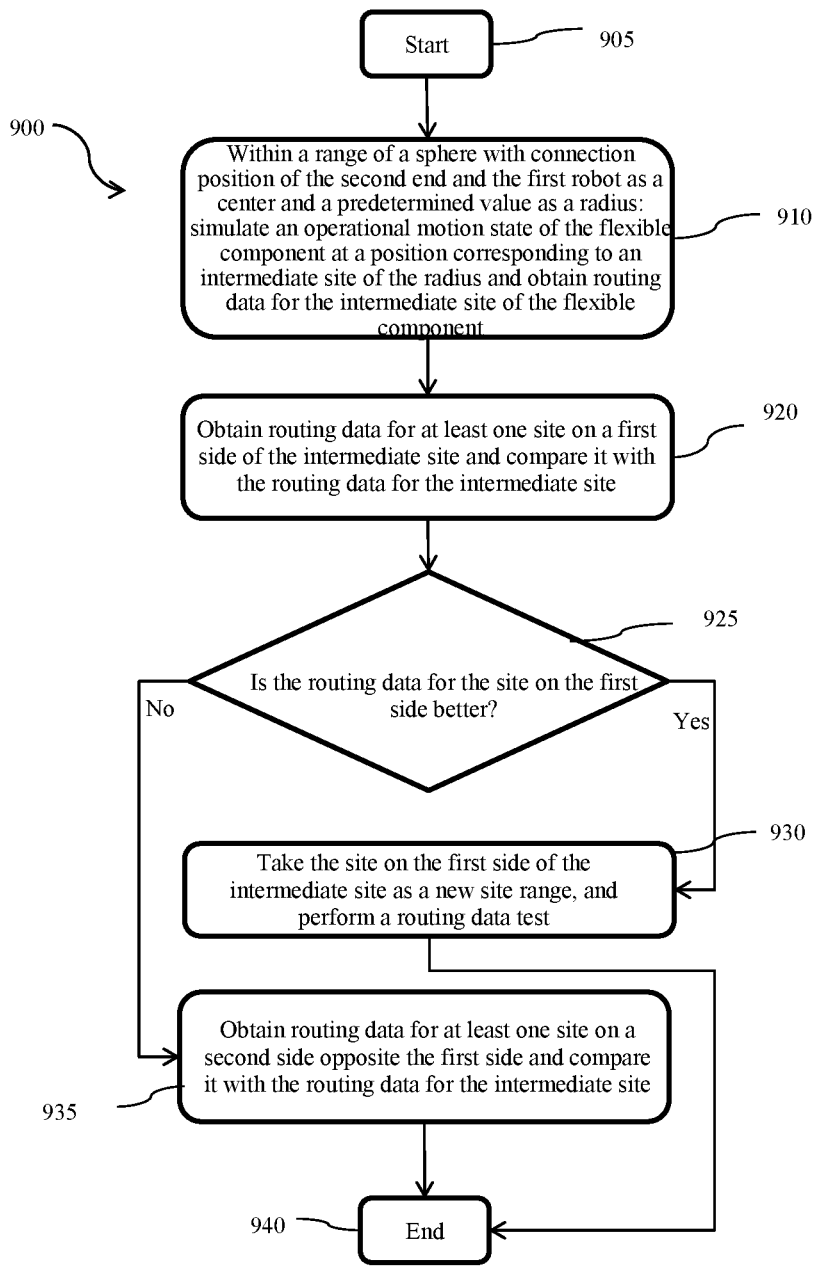
FIG. 9A is a flowchart of a method according to some forms of the present disclosure.
Figure 9B:
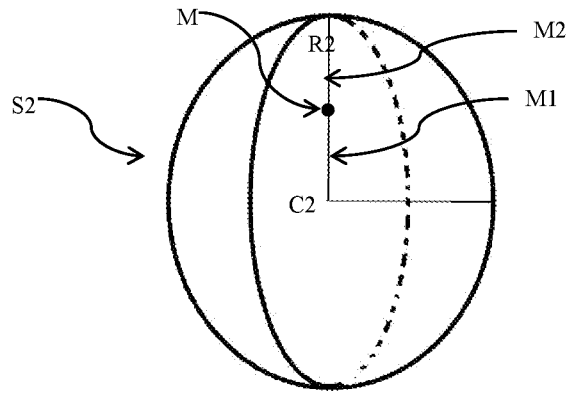
FIG. 9B is a schematic diagram of a sphere according to some forms of the present disclosure.

Referring to FIGS. 9A and 9B, FIG. 9A shows a schematic diagram of a method 900 according to a specific form of the method 100 of the present disclosure, and FIG. 9B shows a schematic diagram of a sphere S2 related to the method 900. In the form shown in FIG. 9A, the first position, the second position . . . up to the nth position of the second end 35 of the flexible component F in the test environment E can be determined using a dichotomy method.

As shown in FIG. 9A, the method 900 may start at block 905. For example, the method 900 may start in response to a need to determine the first position, the second position . . . up to the nth position of the flexible component F in the test environment E.

In block 910, similar to block 810, within a range of the sphere S2 with connection position of the second end 35 of the flexible component F and the first robot 210 as a center C2 and with a predetermined value as a radius R2: an operational motion state of the flexible component F at a position corresponding to an intermediate site M on the radius R2 is simulated and routing data for the intermediate site of the flexible component is obtained. In the form shown in FIG. 9B, the intermediate site M may be determined on the radius R2, and the intermediate site M may be the midpoint of the radius R2, or may be any point on the radius R2. In a form of the present disclosure, the method as described in other parts of the present disclosure may be used to obtain the routing data for the intermediate site of the flexible component F.

Then in block 920, routing data for at least one site on a first side of the intermediate site M is obtained and compared to the routing data for the intermediate site. In the form shown in FIG. 9B, the side of R2 bounded by M is shown as M1 in FIG. 9B, and the other side is shown as M2. In one form, M1 may be closer to the center C2 than M2. For example, the routing data for the at least one site of M1 may be obtained and compared with the routing data for the intermediate site.

Next, in block 925, it is determined whether the routing data for the at least one site on the first side is better. In a form of the present disclosure, determining whether the routing data for the at least one site on the first side is better may include determining whether the routing data for the at least one site on the first side is better than the routing data for the intermediate site.

If it is better, proceed to block 930, where the site on the first side of the intermediate site M is took as a new site range, and a routing data test is performed. In the form shown in FIG. 9B, if the routing data for the at least one site on M1 is better than the routing data for the intermediate site, then the site on M1 can be determined as a new site range, wherein each site can correspond to the first position, the second position, the third position . . . up to the nth position and the routing data test is performed for each site.

If it is worse, proceed to block 935, where routing data for at least one site on a second side opposite the first side is obtained and compared to the routing data for the intermediate site. In the form of FIG. 9B, if the routing data for the at least one site on M1 is worse than the routing data for the intermediate site, each site on M1 can be discarded and the routing data for the at least one site on M2 can be obtained and compared with the routing data for the intermediate site. If the routing data for the at least one site on M2 is better than the routing data for the intermediate site, then the site on M2 can be determined as a new site range, wherein each site can correspond to the first position, the second position, the third position up to the nth position, and the routing data test is performed for each site.

Thereafter, the method 900 ends in block 940.

Using the dichotomy method can significantly improve the efficiency of determining the above-mentioned first position, second position, third position . . . up to the nth position of the flexible component F.

It should be understood by those skilled in the art that, although the sphere is used as an example for description in the forms of the present disclosure, it is intended only for illustration rather than limitation. Without departing from the spirit of the present disclosure, other spatial geometric shapes capable of realizing the concept of the present disclosure are also included within the scope of the present disclosure.

Figure 10:
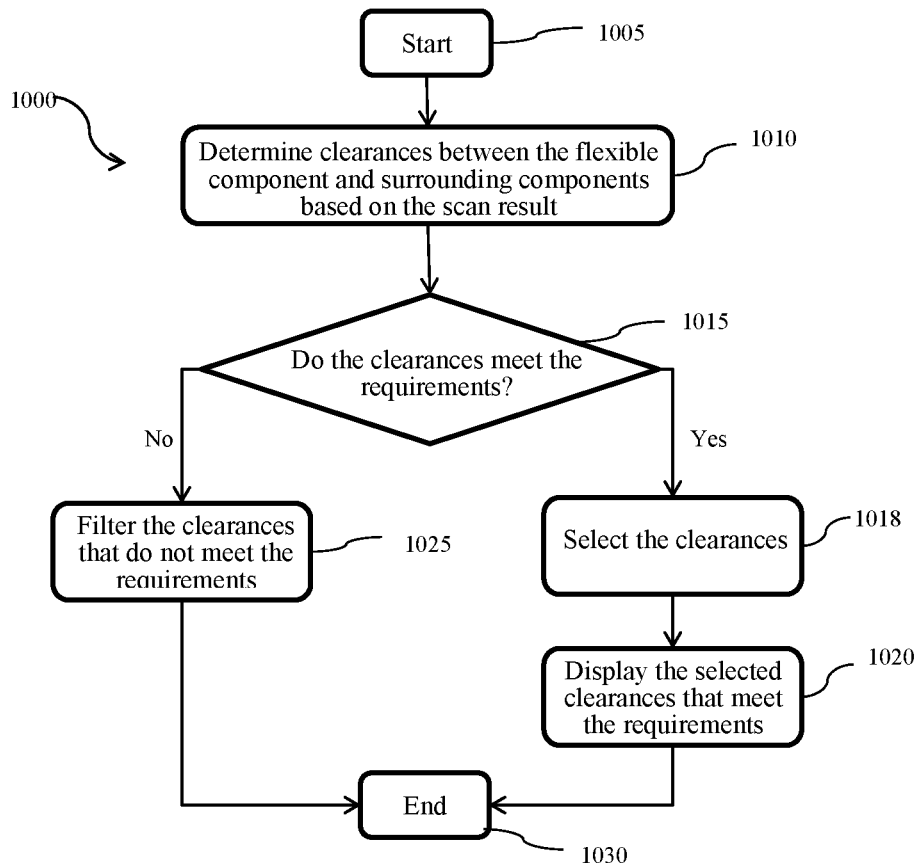
FIG. 10 is a flowchart of a method according to the present disclosure.

Referring to FIG. 10, FIG. 10 shows a schematic diagram of a method 1000 according to a specific form of the method 100 of the present disclosure. Specifically, S120 and S135 may include the steps described in the method 1000.

The method 1000 may start at block 1005. For example, the method 1000 may start in response to scanning the flexible component F by, for example, the scanning device 220.

In block 1010, clearances between the flexible component F and the surrounding components are determined based on the scan results. The surrounding components can be components of the equipment to which the flexible component F is applied and disposed around the flexible component F during application. Therefore, the clearances between the flexible component F and the surrounding components needs to meet requirements, otherwise the flexible component F will interfere with the surrounding components, causing the flexible component F and/or surrounding components to be prone to fatigue wear and even fail to function properly.

In one form of the present disclosure, the surrounding components may be provided and disposed in the test environment E so as to obtain the clearances between the flexible component F and the surrounding components. In order to reflect the situation in practical application, the relative positional relationship between the surrounding components and the flexible component F in practical application can be simulated in the test environment E. For example, the surrounding components can be made by 3D printing technology and disposed in the test environment E. Alternatively, solid components of surrounding components may be provided and disposed in the test environment E.

Alternatively, in another form of the present disclosure, instead of providing the surrounding components, position data about the surrounding components in practical applications may be provided, and the clearances between the flexible component F and the surrounding components are obtained based on the position data.

Next in block 1015, it is determined whether the clearances meet requirements. If the clearances meet the requirements, proceed to block 1018 where the clearances are selected. In one form, better clearances can be automatically screened from the clearances that meet the requirements, for example, the clearances greater than 20 mm. Next, proceed to block 1020, where the selected clearances that meet the requirements are displayed.

If the clearances do not meet the requirements, proceed to block 1025, where the clearances that do not meet the requirements are filtered. Alternatively, the clearances that do not meet the requirements can also be saved as desired. In addition, optionally, the clearances that do not meet the requirements can also be displayed as desired. In one form of the present disclosure, if both the clearances that meet the requirements and the clearances that do not meet the requirements are displayed, the clearances that meet the requirements and the clearances that do not meet the requirements may be displayed in a visually distinct manner. For example, the clearances that meet the requirements and the clearances that do not meet the requirements may be displayed in two colours with strong contrast. As another example, the clearances that meet the requirements and the clearances that do not meet the requirements can be flashed in different ways for easy visual distinction.

Thereafter, the method 1000 may end in block 1030.

Although only the clearances are described in detail in the form of the method 1000, the same applies to other factors, such as, the length of the flexible component F, the relative angle between the first end 40 and the second end 35 of the flexible component F, and the bending radius of the flexible component F. In one form, for the bending radius, the method 100 of the present disclosure may further include the following steps: determining the bending radius of the flexible component F based on the scanning result; determining whether the bending radius meets the requirements; selecting the bending radius that meets the requirements, and displaying the selected bending radius that meets the requirements. In other forms, a similar approach can be used for other factors.

Figure 11:
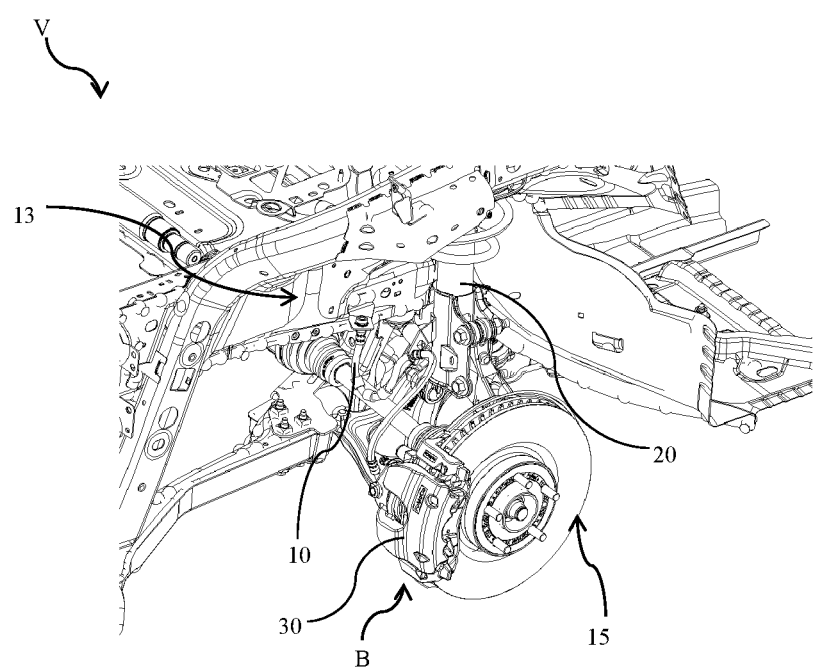
FIG. 11 is a partial perspective view of a vehicle according to the present disclosure.

In one form of the present disclosure, the flexible component F may include a brake hose 10. As shown in FIG. 11, the brake hose 10 may be applied to, for example, a vehicle V, and may transmit fluid (e.g., brake medium) to a braking system B during braking process of the vehicle V to provide the generation of braking force, thereby making the braking of the vehicle V effective. The brake hose 10 is usually connected to a body 13 of the vehicle V at one end and to the braking system B of the vehicle V at the other end. While the vehicle V is driving, when the vehicle V turns and/or passes over a bumpy road surface, wheels 15 may experience one or more of a left turn, a right turn, a jumping up, and a jumping down. At this point the brake hose 10 will move with the movement of the wheels 15. Therefore, after the brake hose 10 is installed on the vehicle V, it needs to be provided that it functions properly (e.g., be able to transfer the brake medium to the brake system B) whether it is moving with the wheels 15 or it is stationary relative to the wheels 15 (e.g., the vehicle V is substantially going straight on a relatively flat road surface). In the form shown in FIG. 11, it is desirable to provide that the clearances between the brake hose 10 and the surrounding components, such as a shock absorber 20 and a brake shoe 30, meet the requirements, so as to ensure that the brake hose 10 does not interfere with these surrounding components while the vehicle V is driving. In addition, it is also desired to provide that the length of the brake hose 10 is suitable to be installed between the body 13 and the brake system B, that the bending radius of the brake hose 10 meets the requirements and/or the angle between both ends of the brake hose 10 meet the requirements, so as to provide that the brake medium can be transmitted to the brake system B through the brake hose 10 without affecting the transmission of the brake medium due to bending. The routing design of the brake hose 10 may be performed according to method 100 and system 200 of the present disclosure.

Figure 12:
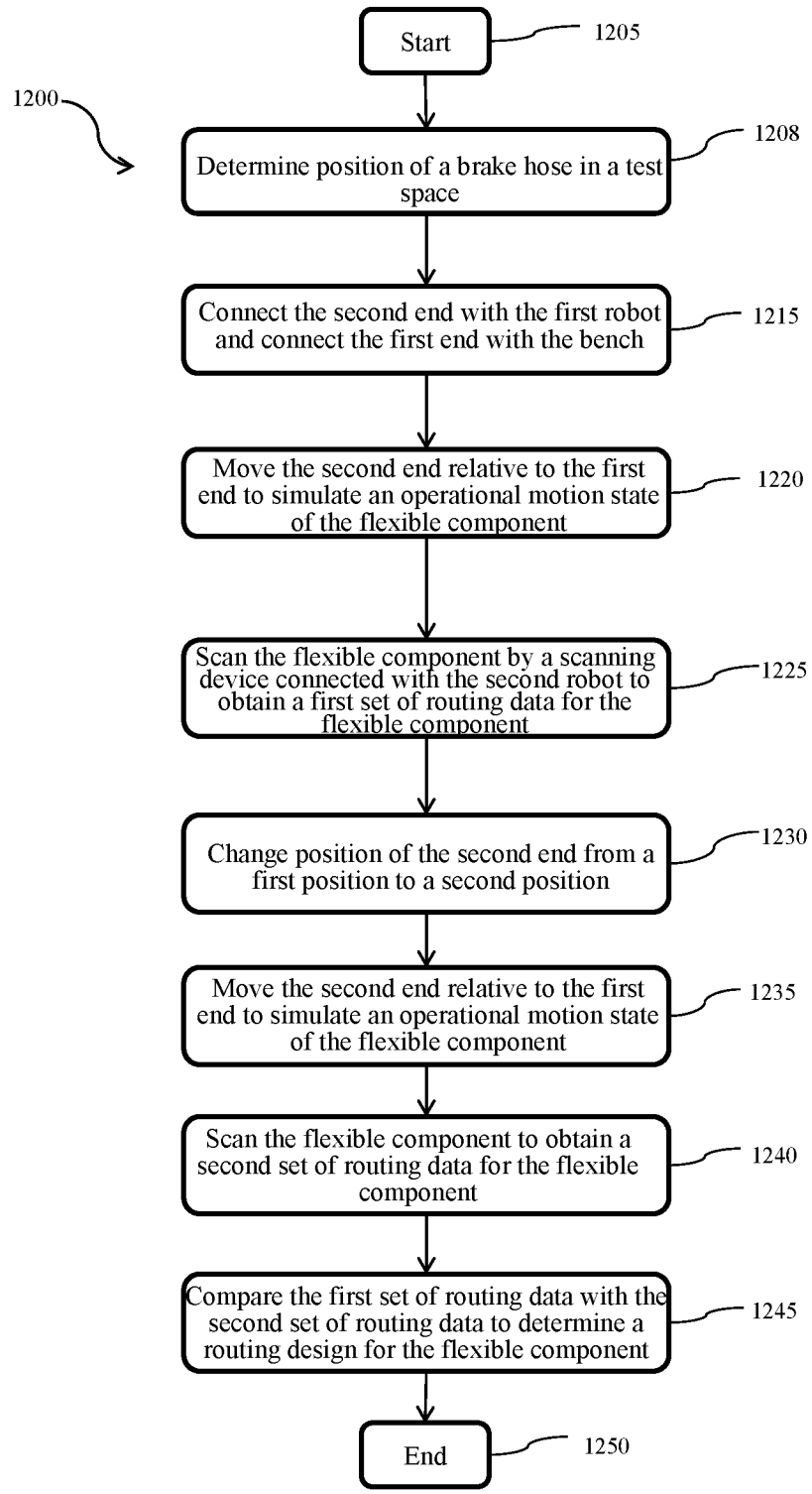
FIG. 12 is a flowchart of a method according to of the present disclosure.

FIG. 12 shows a flowchart of a method 1200 of a specific form of the method 100 of the present disclosure, which can be used in conjunction with the system 200 of the present disclosure for the routing design of the brake hose 10.

The method 1200 may start at block 1205. For example, the method 1200 may start in response to a need for the routing design of the brake hose 10.

Next in block 1208, position of the brake hose 10 in a test space E is determined. First, approximate position of the first and second ends of the brake hose 10 in the test environment E can be pre-estimated based on data related to the application of the brake hose 10 in the vehicle and based on a software such as IPS, CATIA, etc. and then connection position of the first end of the brake hose 10 and the bracket 225 of the bench 205, and connection position of the second end and the first robot 210 can be determined (for example, the connection position with the first robot 210 can be determined as the center C1 or C2 in the method 800 or 900 described in this application). Further, the first position, the second position . . . up to the nth position of the second end of the brake hose 10 in the test space E can be determined according to the method 800 or 900 described in this application.

Next in block 1215, the second end is connected to the first robot 210 and the first end is connected to the bench 205. In the form of the present disclosure, the first end of the brake hose 10 may be clamped by the movable socket joint 240 as described above, and the second end may be fixed with the fixed socket joint 235 via a crimping process. After that, the second end is connected to the first robot 210, and the first end is connected to the bench 205. During the clamping process, since the clamping device of the movable socket joint 240 is releasable, the length of the brake hose 10 can be adjusted by adjusting the fixed position of the first end relative to the movable socket joint 240, to provide a length suitable for connecting between the body and the braking device B and avoid waste due to excessive length. In one form of the present disclosure, the length adjustment of the brake hose 10 may be automatically performed by a drive (e.g., a motor), and the length adjustment of the brake hose 10 may also be performed based on an exhaustive method (e.g., exhaustibly enumerating a predetermined length of the first end of brake hose 10 at predetermined intervals). In addition, the movable socket joint 240 can also be rotated about its axis to adjust the relative angle of the movable joint 240 and the fixed socket joint 235, so that when the brake hose 10 is fixed to the body and the braking system B through the movable joint 240 and the fixed socket joint, respectively, the transmission of the braking medium can be provided without interruption of the transmission of the braking medium due to bending.

Next in block 1220, the second end is moved relative to the first end to simulate an operational motion state of the brake hose 10. In the form of the present disclosure, the connection at the first end can simulate the connection between the brake hose 10 and the body 13, and the connection at the second end can simulate the connection between the brake hose 10 and the brake system B. While the vehicle is driving, the body 13 can be regarded as a relatively static end, and the braking system B can be regarded as a relatively moving end because it is connected to the wheels, therefore, moving the second end relative to the first end can simulate the operational motion state of the brake hose 10 in the vehicle. The simulation of the operational motion state of the brake hose 10 can be realized by the first robot 210. For example, the brake hose 10 can be moved up and down, left and right, and/or rotated at any angle in the test environment E through the motion of the robotic arm of the first robot 210 (e.g., one or more of the first operating portion 212A, the second operating portion 212B and the third operating portion 212C), thereby simulating the left turn, right turn, and jumping up, and jumping down of the wheels of the vehicle.

In block 1225, the brake hose 10 is scanned by the scanning device 220 connected to the second robot 215 to obtain a first set of routing data for the brake hose 10. In one form of the present disclosure, the route data for the brake hose 10 of the present disclosure including the first set of route data and the second set of route data described below may include one or more of the following: clearances between the brake hose 10 and surrounding components, length of the brake hose 10, relative angle between the first and second ends of the brake hose 10, and bending radius of the brake hose 10.

In order to obtain the clearances between the brake hose 10 and surrounding components such as the shock absorber 20 and the brake shoe 30, in one form of the present disclosure, the surrounding components may be provided and disposed in the test environment E relative to the brake hose 10 based on the actual relative position of these surrounding components in the vehicle. These surrounding components may be solid components, such as shock absorbers and brake shoes for practical applications in vehicles, etc.; or alternatively, these components may also be components made via, for example, 3D printing techniques. In another form of the present disclosure, instead of providing these surrounding components, position data about these surrounding components may be acquired based on vehicle virtual data, and may be input into the system 200, and the clearances between the brake hose 10 and the surrounding components can be obtained by comparing the scan data obtained by the scanning device 220 with the input position data.

Next in block 1230, the position of the second end is changed from the first position to the second position. In one form of the present disclosure, the second end 35 of the brake hose 10 may be positioned in the testing environment in a number of positions as determined by block 1208 above. After the first set of routing data for the brake hose 10 corresponding to the first position is obtained for the first position, the first robot 210 positions the second end from the first position to the second position by moving its robotic arm, and in this case, the position of the first end can remain unchanged. Thereafter, in block 1235, the second end is moved relative to the first end to simulate an operational motion state of the brake hose 10 for the second position. The brake hose 10 is scanned in block 1240 to obtain a second set of routing data for the brake hose 10, e.g., to obtain a second set of routing data for the brake hose 10 corresponding to a second location. In block 1245, the first set of routing data is compared with the second set of routing data to determine a routing design for the brake hose 10. By comparing which one of the first and second set of routing data is more satisfactory, a better routing design for the brake hose 10 can be determined.

Thereafter, the method 1200 ends in block 1250.

In another alternative to the method 1200, as an alternative to the steps of block 1245, after block 1240, the first robot 210 may position the second end from the second position to the third position by moving its robotic arm, so as to obtain a third set of routing data corresponding to the third position of the brake hose 10 . . . . The rest can be done in the same manner until the nth set of routing data corresponding to the nth position of the brake hose 10 is obtained. In this case, the method 1200 may also include the step of comparing the first set of routing data to the nth set of routing data to determine a routing design for the brake hose 10.

Alternatively, or additionally, the method 1200 may also include the step of displaying routing data for the brake hose 10. In one form of the present disclosure, one or more sets of routing data including the first set of routing data, the second set of routing data, . . . up to the nth set of routing data may be displayed through the display 365 as described above, and the routing data for the determined routing design of the brake hose 10 may be displayed, for example, the routing data for the determined desired routing design of the brake hose 10 may be displayed, so that the user can produces the brake hoses that are to be actually applied to the vehicle based on the routing data for the routing design of brake hose. In one or more forms of the present disclosure, it is possible that both the first and second set of routing data meet the preset requirements, but a better design can be obtained through the comparison, for example, a design may require a relatively less material length, a greater clearance, and a greater bending radius (sharp bends is avoided). Different from the prior art in which it is only tested and determined whether the design of a component meets the design requirements, and the component is only redesigned if the design requirements are not met, relatively speaking, the logic in this application can obtain a better solution for the routing design. In addition, verification of multiple scenarios and operational conditions can be completed more quickly through a single solid component, without the need to repeatedly print and verify the component. One or more forms of the present disclosure may provide a fast and improved solution.

Figure 13:
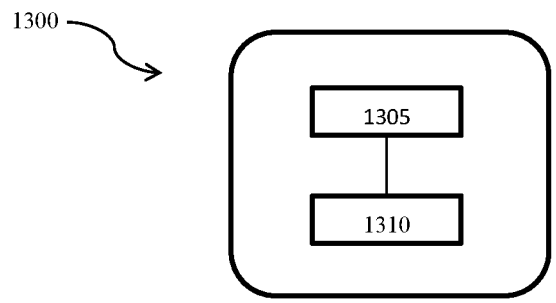
FIG. 13 is a schematic diagram of an apparatus according to a form of the present disclosure.

The present disclosure also provides an apparatus 1300 for flexible component routing design, as shown in FIG. 13, which includes a processor 1305 and a memory 1310. The memory 1310 stores instructions executable by the processor 1305 that, when executed by the processor, cause the processor to implement the steps of the method 100 as described above.

It should be understood that all forms, features and advantages set forth above for the method 100, system 200 according to the present disclosure apply equally to the apparatus 1300 according to the present disclosure, without conflicting with each other. That is to say, all the forms of the method 100, the system 200 and the variations thereof described above can be directly transferred and applied to the apparatus 1300 according to the present disclosure, and are directly incorporated herein. For the sake of brevity of the present disclosure, it is not repeated here.

In summary, compared with the prior art, the present disclosure proposes a method 100, a system 200 and an apparatus 1300 for flexible component routing design. The solution of the present disclosure can improve flexible component routing design and reduce the time and cost for the flexible component routing design. Compared with the prior art in which the original flexible component is discarded, and a new flexible component routing design is carried out and all the operation steps are repeated once the routing design of the flexible component fails to meet the requirements, the present disclosure does not need to repeat all the steps and thus greatly simplify the workload associated with the routing design. In addition, the present disclosure utilizes the combination of artificial intelligence means such as computers and robots and algorithms to accurately determine a desired routing design for the flexible component within a wide coverage range.

Where it is technically possible, the technical features listed in relation to different forms can be combined with each other to form further form within the scope of the present disclosure.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The term "including" is inclusive and has the same scope as "comprising".

The above-mentioned variations are possible examples of implementations of the present disclosure and are given only for the purpose of enabling those skilled in the art to clearly understand the principles of the disclosure. It should be understood by those skilled in the art that the above discussion to any form is only illustrative, and is not intended to imply that the disclosed scope of the forms of the present disclosure (including claims) is limited to these examples; under the overall concept of the disclosure, the technical features in the above forms or different forms can be combined with each other to produce many other changes in different aspects of forms of the disclosure that is not provided in detailed description for the sake of brevity. Therefore, any omission, modification, equivalent replacement, improvement, etc. made within the spirit and principle of the disclosure shall be included in the scope of protection claimed by the disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for flexible component routing design, wherein a flexible component includes a first end and a second end, the method comprising:
    moving the second end relative to the first end to simulate an operational motion state of the flexible component;
    scanning the flexible component to obtain a first set of routing data for the flexible component;
    changing position of the second end from a first position to a second position;
    moving the second end relative to the first end to simulate an operational motion state of the flexible component;
    scanning the flexible component to obtain a second set of routing data for the flexible component; and
    comparing the first set of routing data with the second set of routing data to determine a routing design for the flexible component.

2. The method of claim 1, wherein the first and second set of routing data include one or more of the following: clearances between the flexible component and surrounding components, length of the flexible component, relative angle between the first and second ends of the flexible component, and bending radius of the flexible component.

3. The method of claim 1, further comprising: connecting the second end to a first robot and obtaining routing data for the flexible component under different operational motion states through a scanning device connected to a second robot, wherein the first robot is further configured to position the second end of the flexible component to the first position, to the second position, and simulating motion of a vehicle when the second end is in the first position and the second position, respectively, so as to simulate the operational motion states of the flexible component, and the second robot is configured to cooperate with the first robot to obtain dynamic routing data for the flexible component during simulating the motion of the vehicle.

4. The method of claim 1, wherein simulating the operational motion state of the flexible component comprises simulating an operational motion state when the flexible component is mounted on a vehicle, including: left and/or right turn, jumping up and/or down of wheels.

5. The method of claim 1, further comprising:
    filling the flexible component with fluid from the first or second end and keeping the fluid filled in the flexible component under a pressure for routing data tests under different operational motion states.

6. The method of claim 1, further comprising:
    clamping the second end by a clamping member; and
    adjusting fixed position of the second end relative to the clamping member and/or rotation angle of the second end about itself.

7. An apparatus for flexible component routing design, comprising a processor and a memory, the memory storing processor-executable instructions that, when executed by the processor, cause the processor to implement the steps of the method of claim 1.

8. The method of claim 1, wherein obtaining the first and second set of routing data comprises:
    determining clearances between the flexible component and surrounding components based on the scan result;
    determining whether the clearances meet requirements; and
    displaying the clearances that meet the requirements and/or the clearances that do not meet the requirements.

9. The method of claim 8, wherein displaying the clearances that meet the requirements and the clearances that do not meet the requirements comprises:
    displaying the clearances that meet the requirements and the clearances that do not meet the requirements in a visually distinct manner.

10. The method of claim 8, further comprising:
    providing the surrounding components;
    disposing the surrounding components in a test environment; and
    disposing the flexible component in the test environment.

11. The method of claim 8, further comprising:
    acquiring position data about the surrounding components based on vehicle virtual data.

12. The method of claim 1, further comprising:
    connecting the second end to a first robot and connecting the first end to a bench; and
    obtaining routing data for the flexible component under different operational motion states through a scanning device connected to a second robot.

13. The method of claim 3, wherein the second end is connected to the first robot through a fixed socket joint, and the first end is connected to a bracket on the bench through a movable socket joint.

14. The method of claim 13, wherein the movable socket joint adjusts length of the flexible component by adjusting fixed position of the first end relative to the movable socket joint, and the movable socket joint adjusts relative angle between the movable and fixed socket joints by rotating about its axis.

15. The method of claim 12, further comprising: determining the first position, the second position, a third position up to an nth position, and respectively changing the position of the second end to the third position up to the nth position to obtain n sets of routing data.

16. The method of claim 15, further comprising:
    within a range of a sphere with connection position of the second end and the first robot as a center and a predetermined value as a radius:

exhaustively enumerating sites on the radius at predetermined intervals and respectively determining each of the sites as the first position, the second position, the third position up to the nth position.

17. The method of claim 15, further comprising:
within a range of a sphere with connection position of the second end and the first robot as a center and a predetermined value as a radius;
simulating an operational motion state of the flexible component at a position corresponding to an intermediate site of the radius and obtaining routing data for the intermediate site of the flexible component;
obtaining routing data for at least one site on a first side of the intermediate site and comparing it with the routing data for the intermediate site;
if the routing data for the site on the first side is better, taking the site on the first side of the intermediate site as a new site range, and performing a routing data test; and
if the routing data for the site on the first side is worse, obtaining routing data for at least one site on a second side opposite the first side and comparing it with the routing data for the intermediate site;
wherein the site corresponds to the first position, the second position, the third position up to the nth position.

18. A system for flexible component routing design, the system comprising:
a bench;
a first robot arranged on the bench and connected to a second end of the flexible component;
a second robot arranged on the bench and provided with a scanning device;
a bracket arranged on the bench and connected to a first end of the flexible component; and
a computer connected to one or more of the first robot, second robot, and bracket, respectively, and including a processor and a memory, the memory storing processor-executable instructions that, when executed by the processor, cause the processor to:
moving the second end relative to the first end to simulate an operational motion state of the flexible component;
scanning the flexible component to obtain a first set of routing data for the flexible component;
changing position of the second end from a first position to a second position;
moving the second end relative to the first end to simulate an operational motion state of the flexible component;
scanning the flexible component to obtain a second set of routing data for the flexible component; and
comparing the first set of routing data with the second set of routing data to determine a routing design for the flexible component.

19. The system of claim 18, wherein the flexible component includes a fluid filled therein from the first or second end and keeps the fluid filled therein under a pressure for routing data tests under different operational motion states.

20. The system of claim 18, wherein the flexible component comprises a brake hose.

* * * * *